United States Patent [19]
Porter

[11] Patent Number: 4,979,175
[45] Date of Patent: Dec. 18, 1990

[54] STATE METRIC MEMORY ARRANGEMENT FOR A VITERBI DECODER

[75] Inventor: Jeffrey A. Porter, Tempe, Ariz.
[73] Assignee: Motorola, Inc., Schaumburg, Ill.
[21] Appl. No.: 214,966
[22] Filed: Jul. 5, 1988
[51] Int. Cl.$^5$ .......................................... H03M 13/12
[52] U.S. Cl. .................................................. 371/43
[58] Field of Search ....................... 371/43, 44, 45, 46; 364/900

[56] References Cited
U.S. PATENT DOCUMENTS
| | | | |
|---|---|---|---|
| 4,504,925 | 3/1985 | Gilhousen | 364/900 |
| 4,583,078 | 4/1986 | Shenoy et al. | 371/43 X |
| 4,630,032 | 12/1986 | Gordon et al. | 371/43 X |
| 4,797,887 | 1/1989 | Yamasaki et al. | 371/43 |

OTHER PUBLICATIONS
Proc. of the IEEE, Forney, G., Jr., "The Viterbi Algorithm", vol. 61, No. 3, Mar. 1973, pp. 268-278.
IEEE Trans. on Communications Technology, Viterbi, A., "Convolutional Codes and Their Performance in Communication Systems", vol. COM-19, No. 5, Oct. 1971, pp. 751-772.
IEEE Trans. on Communications Technology, Heller, J., et al., "Viterbi Decoding for Sattelite and Space Communication", vol. COM-19, No. 5, Oct. 1971, pp. 835-848.
Millman, J., *Microelectronics*, McGraw-Hill, pub. 1987, pp. 329-337.

*Primary Examiner*—Charles E. Atkinson
*Assistant Examiner*—Stephen M. Baker
*Attorney, Agent, or Firm*—Frank J. Bogacz

[57] ABSTRACT

An improved memory utilization arrangement for a VITERBI decoder which allows the amount of memory required for storing state metrics to be minimized. Both old and new state metrics are required to be stored. This scheme utilizes memory locations for which old metrics have been previously read for storing the newly calculated metrics. In one implementation of this invention, a barrel shifter is used to calculate the address at which to store and retrieve the appropriate metrics. Another implementation employs a shift register with a shifting and inserting operation to align the metrics in the proper order and at the same time store the new metrics for subsequent calculations. As a result of the saving of memory, the amount of memory and power consumption are reduced substantially.

14 Claims, 3 Drawing Sheets

STATE METRIC MEMORY ARRANGEMENT FOR A VITERBI DECODER

BACKGROUND OF THE INVENTION

This invention pertains to convolutional encoders and VITERBI decoders which reduce the number of bit errors in data communication systems having noisy links and, more particularly, to a state metric memory arrangement for reducing the amount of memory and the number of clock cycles required for VITERBI decoders.

Noise poses a problem for the electronic transmission of data via modern data transmission equipment. Convolutional encoders and VITERBI decoders reduce the bit error rate of transmission links due to noise. Transmission link quality (bit error rate) is equal to the energy per bit divided by the noise density.

Convolutional encoders translate each data bit into a number of symbols which are transmitted via the transmission link. At the receiving end of the transmission link, a decoder, such as a VITERBI decoder, recreates the data by decoding the symbols which describe each data bit. The greater the number of symbols used to describe each bit, the less the resulting bit error rate will be. The VITERBI decoder attempts to match strings of symbols received via the transmission link with predefined strings of symbols in order to detect the data being transmitted.

VITERBI decoders operate by keeping track of several hypothetical sequences of bits. For each possible state of the encoder, a sequence of bits is kept which would result in the encoder ending in that state. A state metric is also kept for each sequence of bits which indicates how closely the received sequence of symbols matches the sequence of bits. Memory elements are required to store the state metric because these metrics are updated as each new set of symbols is received.

Hundreds of memory locations are required for the storage of these state metrics. In satellite communications, the physical size and power consumption of communications devices are of paramount importance.

Two types of decoders are common. In parallel decoders, all state metrics are calculated during a single clock cycle using one add-compare-select (ACS) circuit for each state. Serial decoders use fewer ACS circuits to calculate new state metrics during several clock cycles. Previous serial decoders used "ping-pong" state metric memories (one memory for old state metrics and another memory for new state metrics).

A convolutional decoder manufactured by TRW uses fully duplicated state (path) metric memory.

VITERBI decoder part number STI 5268 manufactured by Stanford Telecommunications, Inc. requires external memory with locations for both previous and current state metrics.

Accordingly, it is an object of the present invention to provide a state metric memory arrangement for a serial decoder which reduces the amount of memory required for state metrics and correspondingly reduces the amount of power consumption for a VITERBI decoder.

SUMMARY OF THE INVENTION

In accomplishing the object of the present invention, a novel state metric memory apparatus is shown.

In one embodiment, a state metric memory arrangement for a VITERBI decoder includes a register for storing a plurality of state metrics. This register serially shifts each of the plurality of state metrics a predefined number of times. Next, a serial to parallel converter is connected to the register. The serial to parallel converter forms required pairs of the state metrics. These required pairs of state are ones required for calculation of new state metrics.

An add-compare-select circuit is connected to the serial to parallel converter and to the register. The add-compare-select circuit calculates the new state metrics from the required pairs of state metrics. Further, the add-compare-select circuit transmits the newly calculated state metrics to the register in a particular order for storage therein. Lastly, the register operates to store certain ones of the newly calculated metrics interleaved with others of the newly calculated state metrics.

In another embodiment, the state metric memory arrangement for a VITERBI decoder includes a state counter. The state counter sequentially generates a series of states indicating which of the state metrics are required for new calculation. An address generator is connected to the state counter. The address generator produces a physical address for retrieving the required state metrics for calculation.

A memory is connected to the state counter and to the address generator. The memory is operated in response to the state counter and to the address generator to store and to retrieve previously stored state metrics.

A state metric calculator is connected to the memory. The state metric calculator operates in response to the retrieved state metrics to calculate new state metrics. The memory operates in response to the address generator and to the state metric calculator to store the newly calculated state metrics at a location indicated by the address generator, ones vacant due to the retrieval operation.

DESCRIPTION OF THE PREFERRED EMBODIMENT

Figure 1:
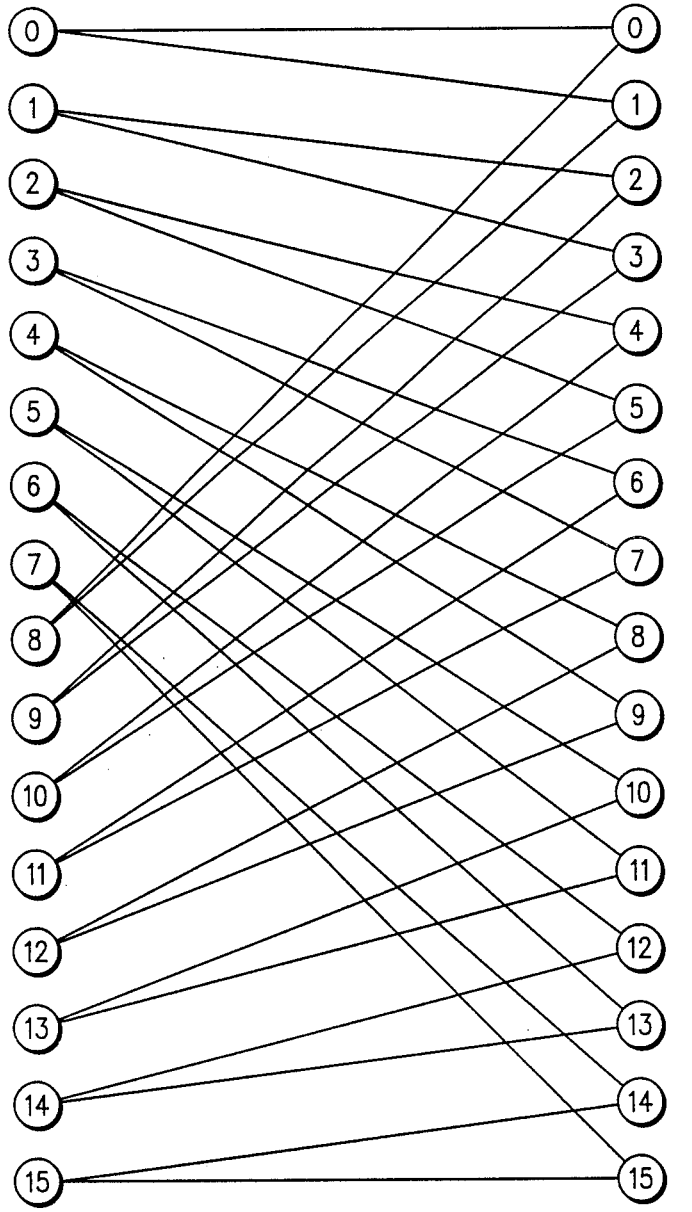
FIG. 1 is a state diagram for convolutional encoder for constraint length equal 5.

Referring to FIG. 1, a state diagram showing the transitions from states to new states of a convolutional encoder is shown. The constraint length of this example is K=5. A convolutional encoder is an arrangement of shift register and gating logic to produce the number of symbols per bit input to the system. As a data bit is encoded to produce a set of symbols, the bit is shifted into the encoder shift register. In this manner, the state of the encoder depends on the last few data bits as well as the present bit. As each new data bit is shifted into the encoder, the encoder makes transitions from one state to one of two possible states as shown in FIG. 1. For example, if we assume that the present state is state 0 and a 0 is shifted into the shift register, a transition from state 0 to state 0 will be made, as shown by the line connecting from state 0 and to state 0. If however, a 1 is shifted into the shift register, a transition will be made from state 0 to state 1. The symbols associated with each of these state transitions are 00 and 11, respectively for a rate R=½ encoder (two symbols per bit). The length of the encoder register is K (the constraint length) minus 1 which results in $2^{K-1}$ possible encoder states.

The decoder determines the possible sequence of symbols which best matches the received sequence of symbols. A VITERBI decoder constantly keeps track of $2^{K-1}$ possible sequences of symbols or paths. The decoder must keep track of one path ending in each of the possible encoder states. The measure of how well the received symbol stream matches a path is called a state metric. All of the state metrics are updated for each new symbol set received. A trial state metric is calculated for both of the paths entering each of the states. The trial metrics for the two paths entering a state are compared and the one showing the best match becomes the new state metric.

Calculating a new state metric requires that two old state metrics be retrieved from memory. Since there are both old and new state metrics, typical VITERBI decoders have utilized two separate memories of the maximum size: one for the old state metrics and one for the new state metrics. When a new state metric is calculated, old state metrics are no longer required to be stored. As a result, the memory space of these old state metrics may be utilized to store these new state metrics. The present invention writes new state metrics into the space freed once a portion of the old state metrics have been utilized in a calculation.

Figure 2:
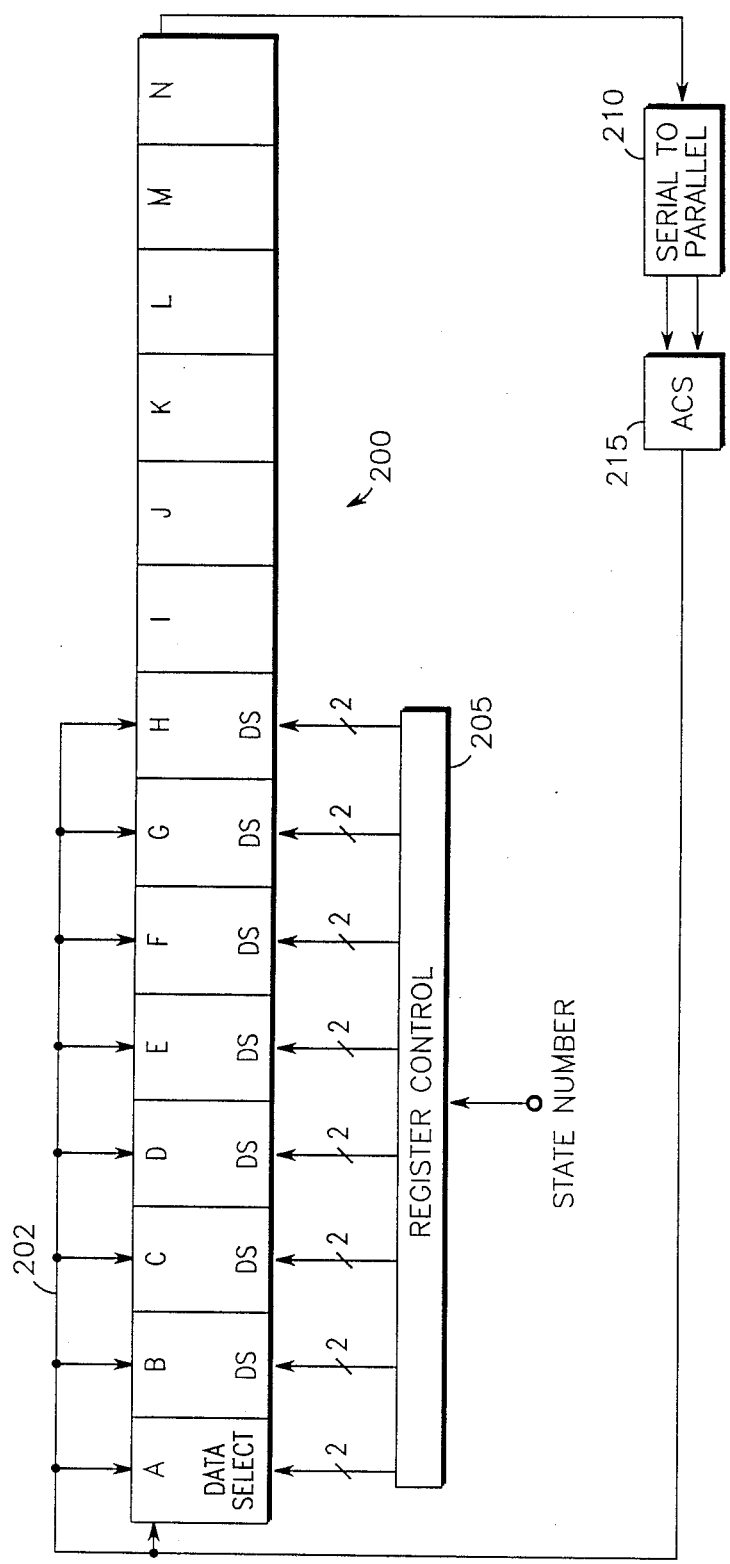
FIG. 2 is a block diagram of a "shift register" type implementation embodying the principles of operation of the present invention.

Referring to FIG. 2, a "shift register" type implementation of the present invention is shown. This "shift register" type implementation utilizes two types of registers. For example, for a constraint length (K=5), shift register 200 comprises 14 registers (A through N). Registers A through H of shift register 200 are registers which are controlled via the data select leads of register control unit 205. Each register A through H is connected to register control 205 via a unique pair of data select leads. Register control 205 derives each data select lead from the state number input to it. Registers A through H may be controlled to either shift to the right one digit position, hold the contents of the register or load a new state present on data bus 202.

Registers I through N of register 200 are conventional shift registers and operate only to shift their contents right by one digit position upon being clocked. The output of the last shift register segment (N) is connected to serial to parallel device 210.

Serial to parallel device 210 converts the two metrics which are stored in consecutive registers into two since two old metrics are needed to calculate a new metric. Serial to parallel device 210 is connected to add-compare-select circuit (ACS) 215 via two buses. Each bus transmits one of the previously stored state metrics. ACS circuit 215 is connected to register A of shift register 200 via bus 202. In addition, ACS 215 is connected to each of the registers A through H and may directly load the state metrics to any of these registers A through H in a parallel fashion.

The last stage register N of shift register 200 contains the state metrics required for calculating the new metrics. For the first half of the state metric recalculation cycle, the entire shift register operates in a conventional manner. That is, each register A through N of shift register 200 shifts to the right one digit position. The data select leads of registers A through H are set such that they perform the conventional shifting operation only for the first eight cycles.

When half of the new metrics have been shifted into the shift register 200, the remaining metrics are inserted into the shift register at the proper place where they will be required for calculation during the next cycle. For this example, the constraint length is K=5 and the rate is ½. There are two symbols per bit. This is by way of example only and the invention is not limited to this particular constraint length and rate. For example, metric 0 is now in register H since half the cycle has been completed by simple shifting. As metric 0 is shifted out of register H to register I, metric 8 is inserted into register H from ACS 215 via data bus 202. Register control 205 operates registers A through G to hold their present values and operates register H to directly load from data bus 202, the value transmitted from ACS 215. This can be seen from Table 1 by going down the column of register I until metric 0 is observed in this register and then looking immediately to the left to the column for the register H to see that metric 8 has been inserted immediately following metric 0. Previously metric 1 has followed metric 0. (See columns G and H, one row up.) As can be seen from Table 2 and FIG. 1, metrics 0 and 8 are the metrics required for the calculation of new metrics 0 and 1.

TABLE 1

| REGISTER CONTENTS | | | | | | | | | | | | | |
|---|---|---|---|---|---|---|---|---|---|---|---|---|---|
| A | B | C | D | E | F | G | H | I | J | K | L | M | N |
| 7 | 6 | 13 | 5 | 12 | 4 | 11 | 3 | 10 | 2 | 9 | 1 | 8 | 0 |
| 7 | 14 | 6 | 13 | 5 | 12 | 4 | 11 | 3 | 10 | 2 | 9 | 1 | 8 |
| 15 | 7 | 14 | 6 | 13 | 5 | 12 | 4 | 11 | 3 | 10 | 2 | 9 | 1 |
| 0 | 15 | 7 | 14 | 6 | 13 | 5 | 12 | 4 | 11 | 3 | 10 | 2 | 9 |
| 1 | 0 | 15 | 7 | 14 | 6 | 13 | 5 | 12 | 4 | 11 | 3 | 10 | 2 |
| 2 | 1 | 0 | 15 | 7 | 14 | 6 | 13 | 5 | 12 | 4 | 11 | 3 | 10 |
| 3 | 2 | 1 | 0 | 15 | 7 | 14 | 6 | 13 | 5 | 12 | 4 | 11 | 3 |
| 4 | 3 | 2 | 1 | 0 | 15 | 7 | 14 | 6 | 13 | 5 | 12 | 4 | 11 |
| 5 | 4 | 3 | 2 | 1 | 0 | 15 | 7 | 14 | 6 | 13 | 5 | 12 | 4 |
| 6 | 5 | 4 | 3 | 2 | 1 | 0 | 15 | 7 | 14 | 6 | 13 | 5 | 12 |
| 7 | 6 | 5 | 4 | 3 | 2 | 1 | 0 | 15 | 7 | 14 | 6 | 13 | 5 |
| 7 | 6 | 5 | 4 | 3 | 2 | 1 | 8 | 0 | 15 | 7 | 14 | 6 | 13 |
| 7 | 6 | 5 | 4 | 3 | 2 | 9 | 1 | 8 | 0 | 15 | 7 | 14 | 6 |
| 7 | 6 | 5 | 4 | 3 | 10 | 2 | 9 | 1 | 8 | 0 | 15 | 7 | 14 |
| 7 | 6 | 5 | 4 | 11 | 3 | 10 | 2 | 9 | 1 | 8 | 0 | 15 | 7 |
| 7 | 6 | 5 | 12 | 4 | 11 | 3 | 10 | 2 | 9 | 1 | 8 | 0 | 15 |
| 7 | 6 | 13 | 5 | 12 | 4 | 11 | 3 | 10 | 2 | 9 | 1 | 8 | 0 |
| 7 | 14 | 6 | 13 | 5 | 12 | 4 | 11 | 3 | 10 | 2 | 9 | 1 | 8 |
| 15 | 7 | 14 | 6 | 13 | 5 | 12 | 4 | 11 | 3 | 10 | 2 | 9 | 1 |
| 0 | 15 | 7 | 14 | 6 | 13 | 5 | 12 | 4 | 11 | 3 | 10 | 2 | 9 |

TABLE 2

| THESE OLD METRICS ARE NEEDED | | TO CALCULATE THESE NEW METRICS | |
|---|---|---|---|
| Metrics | 0 and 8 | Metrics | 0 and 1 |
| | 1 and 9 | | 2 and 3 |
| | 2 and 10 | | 4 and 5 |
| | 3 and 11 | | 6 and 7 |
| | 4 and 12 | | 8 and 9 |
| | 5 and 13 | | 10 and 11 |
| | 6 and 14 | | 12 and 13 |
| | 7 and 15 | | 14 and 15 |

Looking down at the next row in Table 1, it may be seen that on the next shift, metric 9 is inserted into register G immediately after metric 1 has been shifted from register G to register H. This process of shifting one metric and inserting the appropriate metric behind it while holding all metrics to the left of the insertion in place, is repeated until the resulting output of shift register 200 has the metrics in the form shown Table 2 under the old metrics. Note that for any pipeline computational delays the length of memory register 200 may be reduced.

This process of utilizing memory locations which have already been used for calculations decreases by at least one half the number of register memories required. As a result, the power consumption of these memories is also reduced. Since such systems are particularly useful in satellite communications where physical size and power consumption is of great importance, the present invention is particularly useful for satellite communications. Overall memory and power consumption may be reduced by as much as 12 percent.

Figure 3:
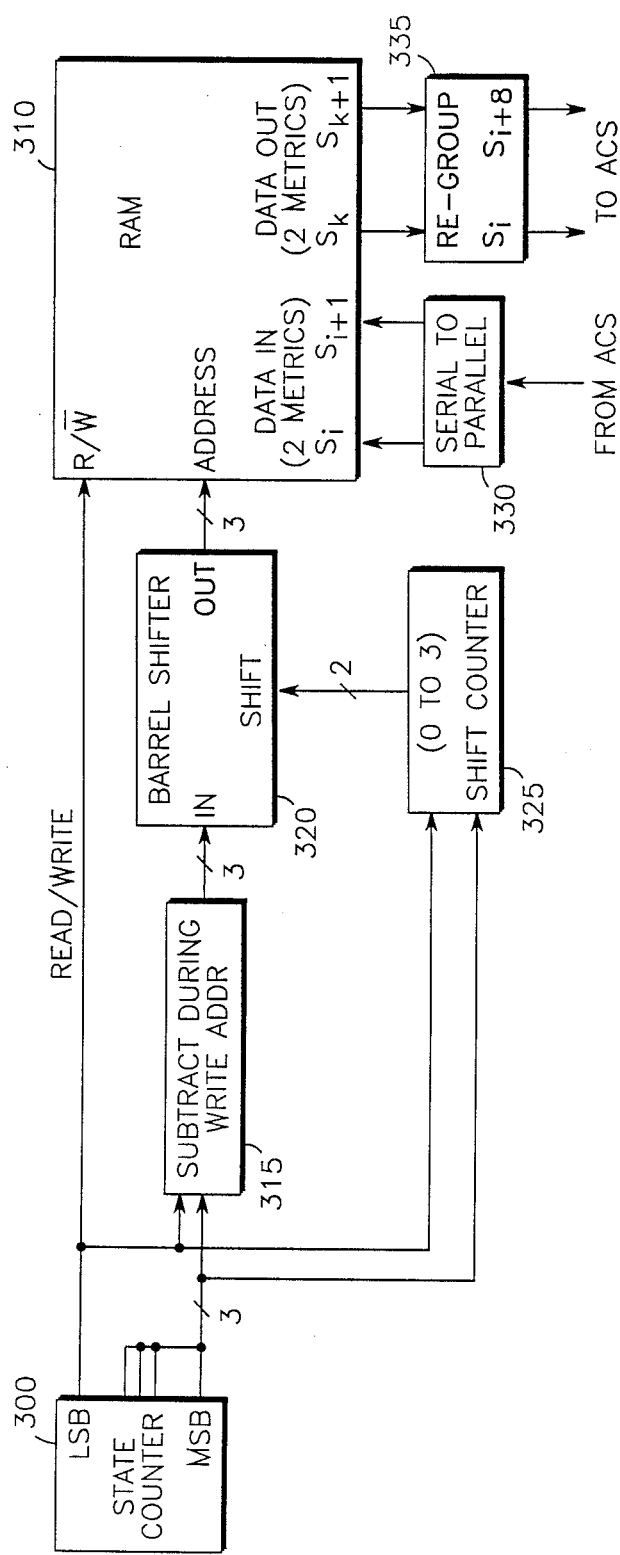
FIG. 3 is a block diagram of a RAM implementation embodying the principles of operation of the present invention.

Referring to FIG. 3, a random access memory (RAM) implementation of the present invention is shown. Since this invention is random access memory based, then the addressing scheme provided must specify unique addresses to be input to the RAM in order to retrieve the state metrics in proper sequence for calculations. For the RAM based implementation shown in FIG. 3, it will be assumed again that the constraint length K will be equal to 5 and the rate will be equal to ½. The decoder of FIG. 3 has 16 states as shown in FIG. 1. An ACS (not shown) calculates one new state metric during each clock cycle. Two metrics are stored in each memory location. The metrics are stored in RAM in even-odd pairs such as, metrics 0 and 1 (a pair), 2 and 3 (a pair), etc. Two pairs of metrics are read out of RAM 310 and regrouped by regroup circuit 335 to form the pairs needed by the ACS. The metric pairs required are shown in Table 2 above. For example, pairs 0 and 1 and 8 and 9 are read out of RAM memory 310 and regrouped by circuit 335 to form pairs 0 and 8 and 1 and 9 which are needed to calculate the new state metrics for metrics 0 and 1 and 2 and 3, respectively. See Table 2 above. Newly calculated metrics are stored in memory locations of RAM 310 which are no longer needed.

The least significant bit (LSB) of the state counter 300 is used to generate the read/write signal which corresponding lead connects the state counter 300 to RAM memory 310. The read/write lead also connects state counter 300 to shift counter 325. The remaining bits of the state counter are connected to subtract circuit 315 via a bus. In addition, this bus is also connected to shift counter 325.

Barrel shifter 320 is connected between subtract circuit 315, RAM 310 and shift counter 325. Barrel shifter 320 supplies the address of which location is to be read or written to RAM memory 310. Serial to parallel circuit 330 connects the add-compare-select circuit (ACS) to RAM 310. The data transmitted from serial to parallel register 330 comprises two metrics which are to be stored in RAM memory 310. Regroup circuit 335 is connected to the data bus of RAM 310 and operates to receive two metrics for regrouping before sending to the ACS.

TABLE 3

| ORDER OR ACCESS | PHYSICAL LOCATION | CONTENTS BEFORE CYCLE n | | | |
|---|---|---|---|---|---|
| | | 0 | 1 | 2 | 3 |
| | 0 | 00/01 | 00/01 | 00/01 | 00/01 |
| | 1 | 08/09 | 02/03 | 04/05 | 08/09 |
| | 2 | 02/03 | 04/05 | 08/09 | 02/03 |
| | 3 | 10/11 | 06/07 | 12/13 | 10/11 |
| | 4 | 04/05 | 08/09 | 02/03 | 04/05 |
| | 5 | 12/13 | 10/11 | 06/07 | 12/13 |
| | 6 | 06/07 | 12/13 | 10/11 | 06/07 |
| | 7 | 14/15 | 14/15 | 14/15 | 14/15 |
| 0 1 2 3 4 5 6 7 | | | | | |
| 0 4 1 5 2 6 3 7 | | | | | |

TABLE 3-continued

| ORDER OR ACCESS | PHYSICAL LOCATION | CONTENTS BEFORE CYCLE n | | | |
|---|---|---|---|---|---|
| | | 0 | 1 | 2 | 3 |
| 0 2 4 6 1 3 5 7 | | | | | |

As an example of the operation of the RAM circuit of FIG. 3, pairs 0 and 1 and 8 and 9 are read out of RAM memory 310 during two clock cycles. As can be seen from Table 3, in the cycle 0 column, metric 0 and 1 reside in physical location 0 and metrics 8 and 9 reside in physical location 1. Therefore, the order of access during the first cycle is for location 0 of RAM memory to be read first and then location 1. Location 0 originally contained metrics 0 and 1 and location 1 originally contained metrics 8 and 9. From Table 2 it can be seen that metrics 0 and 8 are required to produce new metrics 0 and 1 and that metrics 1 and 9 are required to produce new metrics 2 and 3. Regroup circuit 335 performs the function of aligning metric 0 and 8 and 1 and 9 for the calculation by ACS circuit. The ACS circuit first calculates metrics 0 and 1 and returns them through serial to parallel circuit 330. These metrics must be stored in RAM 310. Since physical locations 0 and 1 have had their metrics read during cycle 0, these locations are now available. Newly calculated metrics 0 and 1 are stored in physical location 0 and metrics 2 and 3 are stored in physical location 1. State counter 300 provides the address with which to access RAM 310. Subtract circuit 315 decrements to account for processing delays by the ACS circuit. Barrel shifter 320 shifts the address of state counter 300 for RAM memory the number of times indicated by shift counter 325.

During the next cycle, metrics are processed in the same counting order from 0 to 15, however, different physical addresses to address RAM 310 are required because the metrics are now stored in different physical locations. Every three cycles, as shown in Table 3, the physical location of the state metrics returns to the original pattern. The physical address at which to address RAM memory 310 for reading the correct metrics for processing during the cycle may be formed by passing the counting sequence from state counter 300 through barrel shifter 320. Each cycle the address bits are rotated one more bit position. RAM memory write addresses are also rotated one less position than read addresses during the overlap between the first read of a new cycle and the last write of the previous cycle. Barrel shifter 320 may be implemented with an integrated circuit part number MC74F350 in Schottky TTL logic such as that manufactured by Motorola, Inc.

Note that the order of the state metrics is the same during each cycle. For example, the third read produces the metric pair 2 and 3 whether reading from physical location 2 during cycle 0, physical location 1 during cycle 1 or physical location 4 during cycle 2. The third write operation always puts the new metrics 4 and 5 into the location of the third read operation.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A state metric memory arrangement for a VITERBI decoder comprising:

register means for storing a plurality of state metrics, said register means operating to serially shift each of said plurality of state metrics a predefined number of times;

serial to parallel means connected to said register means, said serial to parallel means operating to form required pairs of said state metrics;

add-compare-select means connected to said serial to parallel means and to said register means, said add-compare-select means operating to calculate new state metrics and operating to transmit said new state metrics to said register means in a particular order for storage; and said register means further operating to store certain ones of said new state metrics interleaved with others of said new state metrics.

2. A state metric memory arrangement as claimed in claim 1, wherein there is further included control means connected to said register means, said control means operating to control said interleaved storing of said register means.

3. A state metric memory arrangement as claimed in claim 2, said register means including a first plurality of register unit means, including at least a first and a last register unit means, said first plurality of register unit means being serially connected, each of said first plurality of register unit means connected to and operating in response to said control means to sequentially shift said state metrics, and said first plurality of register unit means further operating in response to said control means to inhibit said sequential shifting, and a particular one of said first plurality of register unit means operating in response to said control means to directly insert a particular state metric from said add-compare-select means into said particular register unit means.

4. A state metric memory arrangement as claimed in claim 3, said register means further including a second plurality of register unit means, including at least a first and last register unit means, said second plurality of register unit means being serially connected, said first register unit means of said second plurality being serially connected to said last register unit means of said first plurality and last register unit means of said second plurality being connected to said serial to parallel means, said second plurality of register unit means operating to sequentially shift said new state metrics of said last register unit means of said first plurality to said serial to parallel means.

5. A state metric memory arrangement as claimed in claim 4, said connection of said add-compare-select means to each of first plurality of register unit means including a bus connection for parallel loading of said state metrics into selected ones of said first plurality of register unit means.

6. A state metric memory arrangement as claimed in claim 5, said connection of said control means to each of said first plurality of register means including a bus connection.

7. A state metric memory arrangement for a VITERBI decoder comprising:

state counter means for generating a series of states indicating which of said state metrics are required for processing;

address generation means connected to said state counter means and operating to produce a physical address of retrieving said required state metrics;

memory means connected to said state counter means and to said address generation means, said memory means for storing said state metrics, said memory means operating in response to said state counter means and to said physical address of said address generation means to retrieve previously stored state metrics;

said address generation means including shifting means connected to said memory means and coupled to said state counter means, said shifting means operating in response to said state counter means to transform said state of said state counter means to an address for accessing said memory means for retrieving said stored state metrics and for storing said pairs of said new state metrics;

said shifting means including barrel shifting means;

state metric calculation means connected to said memory means, said state metric calculation means operating in response to said retrieved state metrics to calculate new state metrics; and said memory means further operating in response to said address generation means and to said state metric calculation means to store said new state metrics at a location from which said required state metrics were retrieved.

8. A state metric memory arrangement as claimed in claim 7, said state metric calculation means including:

regrouping means connected to said memory means, said regrouping means operating to receive a plurality of said state metrics and operating to order said received state metrics so that regrouped state metrics are simultaneously presented for calculation; and add-compare-select means connected to said regrouping means, said add-compare-select means operating to calculate said new state metrics from said regrouped state metrics.

9. A state metric memory arrangement as claimed in claim 8, said state metric calculation means further including:

serial to parallel means connected to said add-compare-select means, said serial to parallel means operating to produce pairs of said new state metrics;

said memory means operating in response to said address generation means to store said pairs of new state metrics.

add-compare-select means connected to said regrouping means, said add-compare-select means operating to calculate said new state metrics from said regrouped state metrics.

10. A state metric memory arrangement as claimed in claim 9, said address generation means further including adjusting means connected between said shifting means and said state counter means, said adjusting means operating to subtract a predetermined number from said state indicating a time delay for retrieving and storing said state metrics from said memory means.

11. A state metric memory arrangement as claimed in claim 10, said address generation means further including shift counter means connected between said state counter means and said shifting means, said shift counter means operating to control said shifting means to shift said state of said state counter to form an address for accessing said state metric memory.

12. A state metric memory arrangement as claimed in claim 11, said state metric memory including a random access memory (RAM).

13. A state metric memory arrangement as claimed in claim 11, said state counter means further connected to said state metric memory of transmitting a read/write signal to said state metric memory.

14. A state metric memory arrangement for a VITERBI decoder comprising:
  register means for storing a plurality of state metrics, said register means operating to serially shift each of said plurality of state metrics a predefined number of times;
  state metric calculation means connected to said register means, said state metric calculation means operating upon required pairs of state metrics to produce new state metrics in a particular order for storage; and
  said register means further operating to store certain ones of said new state metrics interleaved with others of said new state metrics.

* * * * *